(12) United States Patent
McQuarrie et al.

(10) Patent No.: US 6,409,876 B1
(45) Date of Patent: *Jun. 25, 2002

(54) APPARATUS FOR ETCHING A WORKPIECE

(75) Inventors: Andrew Duncan McQuarrie, San Jose; Lee Campbell Boman, Belmont, both of CA (US)

(73) Assignee: Surface Technology Systems, plc, Newport (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 54 days.

(21) Appl. No.: 09/065,622

(22) Filed: Apr. 24, 1998

(30) Foreign Application Priority Data

May 13, 1997 (GB) .............................. 9709659

(51) Int. Cl.⁷ ................................ C23F 1/02
(52) U.S. Cl. ............................. 156/345 V; 156/345 MC
(58) Field of Search .................... 156/345, 345 V, 156/345 MC

(56) References Cited

U.S. PATENT DOCUMENTS

| | | | |
|---|---|---|---|
| 4,190,488 A | * | 2/1980 | Winters ........................ 156/643 |
| 4,478,677 A | * | 10/1984 | Chen et al. ................... 156/635 |
| 5,312,509 A | * | 5/1994 | Eschbach ...................... 156/345 |
| 5,316,979 A | | 5/1994 | MacDonald et al. |
| 5,340,437 A | * | 8/1994 | Erk et al. .................... 156/639 |
| 5,658,417 A | * | 8/1997 | Watanabe ...................... 156/345 |

FOREIGN PATENT DOCUMENTS

| | | |
|---|---|---|
| DE | 42 41 045 C1 | 5/1994 |
| EP | 0 729 175 A1 | 8/1996 |
| EP | 0822584 A2 * | 7/1997 |
| EP | 0 822 584 A2 | 2/1998 |
| WO | WO 96/23229 | 8/1996 |

OTHER PUBLICATIONS

Xenon Difluoride Etching of Silicon for MEMS. By Floy I. Chang. Abstract.
Search and Display the Results from the Internet.
Ibbotson D.E. et al: "Plasmaless dry etching of silicon with fluorine–containing compounds" Journal of Applied Physics, Nov. 1984 U.S.A., vol. 56, No. 10, pp. 2939–2942.

* cited by examiner

Primary Examiner—Benjamin L. Utech
Assistant Examiner—Charlotte A. Brown
(74) Attorney, Agent, or Firm—Volentine Francos, PLLC

(57) ABSTRACT

An $XeF_2$ source includes a $XeF_2$ source chamber having a tray or ampoule for $XeF_2$ crystals, a reservoir coupled to the $XeF_2$ source chamber via a valve, a flow controller fed by the reservoir and a valve between the reservoir and the flow controller. Pressure sources are provided respectively to maintain the reservoir and the source chamber at the sublimation pressure of $XeF_2$. The arrangement allows for a steady supply of $XeF_2$ to an etching chamber.

8 Claims, 1 Drawing Sheet

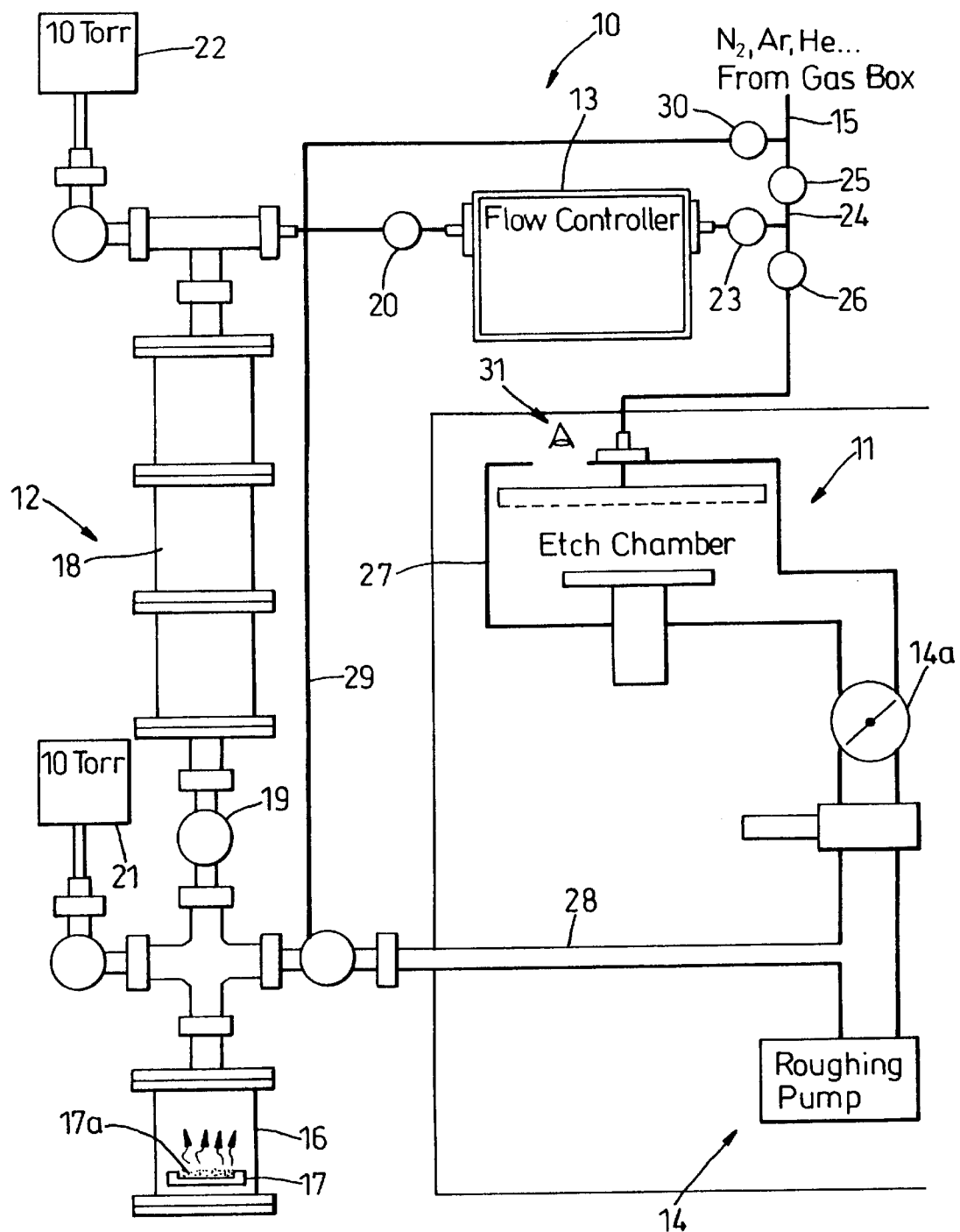

APPARATUS FOR ETCHING A WORKPIECE

BACKGROUND OF THE INVENTION

1. Field of the Invention

This invention relates to methods and apparatus for etching a workpiece using Xenon Difluoride ($XeF_2$). Xenon Difluoride is a dry isotropic gas phase etchant, which provides a gentle etch for silicon at low temperature. Xenon Difluoride is usually supplied in the form of colourless crystals which sublime without decomposition. The sublimation pressure for $XeF_2$ is approximately 4 Torr.

2. Description of the Background Art

Present attempts to use $XeF_2$ for etching have been essentially experimental and have taken place using a pulsed supply of $XeF_2$ which requires the etch to be stopped and started with the etch chamber being pumped down between each etch step. Such an arrangement is impracticable for production processes. Direct flow has been attempted unsuccessfully.

From one aspect the invention consists in a method of etching a workpiece using $XeF_2$, including allowing $XeF_2$ in its solid phase to sublimate into its gaseous state into a reservoir of sufficient volume to provide gas at a pre-determined flow rate for a pre-determined etch period, supplying the gas at the desired flow rate to an etching chamber containing the workpiece and etching the workpiece.

The $XeF_2$ gas may be mixed with an inert carrier gas prior to its introduction into the etch chamber. It is particularly preferred that the $XeF_2$ source continues to sublimate during the outward flow of $XeF_2$ from the reservoir. Additionally or alternatively the reservoir may be re-charged between the etching of separate workpieces.

From a further aspect the invention consists in apparatus for etching a workpiece including, an etched chamber, a $XeF_2$ source, a reservoir, a valve for connecting the source to the reservoir to allow sublimation of the source into $XeF_2$ gas, a flow controller for feeding the etch chamber and a valve for connecting the reservoir to the flow controller.

Preferably the apparatus includes pressure controlles means for maintaining the reservoir at approximately the sublimation pressure of $XeF_2$ when there is no outward flow from the reservoir. Means may be provided for mixing the $XeF_2$ gas with an inert carrier gas prior to its introduction into the process chamber. It is particularly preferred that is the flow controller is a pressure-based flow controller.

A chamber will normally be provided for the solid $XeF_2$ and conveniently the reservoir may have a volume which is approximately three times the volume of the XeF chamber.

Although the invention has been described above, it is to be understood that it includes any inventive combination of the features set out above or in the following description.

BRIEF DESCRIPTION OF THE DRAWING

The invention may be performed in various ways and a specific embodiment will be described, by way of example, with reference to the accompanying drawing, which is a schematic view of etching apparatus.

DETAILED DESCRIPTION OF THE PREFERRED EMBODIMENTS

An etching apparatus is generally indicated at 10 and comprises at etch chamber 11, a $XeF_2$ supply generally indicated at 12, a flow controller 13, a roughing pump assembly, generally indicated at 14, and a carrier gas supply 15.

The $Xef_2$ supply comprises a $XeF_2$ source chamber 16, which includes a tray or ampoule 17 for the $XeF_2$ crystals 17a. The source chamber 16 is connected to a reservoir 18 via a valve 19, which in turn is connected to the flow controller 13 by a valve 20. Pressure sources 21 and 22 are provided to respectively maintain the reservoir 18 and source chamber 16 at approximately 4 Torr which is the sublimation pressure of $XeF_2$. Downstream of the controller 13 is a valve 23 which connects the flow controller to a supply line 24 between valves 25 and 26. Valve 25 controls the flow of the carrier gas from supply 15 into the supply is line 24, whilst valve 26 controls the supply of gases in the supply line 24 to an etch chamber 27 of the etching apparatus 11. As is conventional the roughing pump installation 14 is connected downstream of the etch chamber 27, but it is also connected to the source chamber 16 via bypass 28. A line 29 and valve 30 allows carrier gas to be supplied to this region for purging purposes.

In this the $XeF_2$ crystals are placed in the ampoule or tray 17 with the valve 19 closed and valve 30 open. Carrier gas is used to purge the chamber and the roughing pump assembly 14 pumps the source down to the sublimation pressure. The roughing pump assembly and carrier gas are then isolated and valve 19 is opened allowing $XeF_2$ gas to expand or diffuse into the reservoir 18.

A wafer is then loaded into the etch chamber 27 using conventional apparatus and valves 20, 23, 25 and 26 open sequentially to allow $XeF_2$ and the carrier gas into the etch chamber where etching occurs spontaneously. The pressure within the chamber is controlled by the roughing pump assembly 14 and its automatic pressure control valve 14a. On certain occasions carrier gas may not be required in which case valve 25 remains closed.

Valve 19 may be open or closed, depending on the process and production levels which are required. An optical detector generally indicated at 31 determines when the etch has been completed or alternatively a time basis may be used. Upon completion of the etch valves 20, 23, 25 and 26 are shut and the wafer is removed. By the time a new wafer is introduced into the chamber for etching the reservoir 18 is re-charged and thus not only can each water be fully etched in one process, continuous etching of wafers is achieved. Continuous delivery of $XeF_2$ also enhances uniformity and the use of a pressure based flow control mechanism 13 is considerably beneficial over say mass flow measurement. it will be noted that the process chamber pressure control is independent of the flow control mechanism for $XeF_2$.

What is claimed is:

1. An apparatus for etching a workpiece comprising:
   an etch chamber;
   a source chamber which is capable of containing a gas;
   a first pressure source which is capable of providing a sublimation pressure of the gas within the source chamber;
   a reservoir;
   at least one first valve which is connected between the source chamber and the reservoir such that the source chamber is in fluid communication with the reservoir when the first valve is open;
   a flow controller, having a gas input and a gas output, which is capable of controlling a flow rate of the gas which flows from the gas input to the gas output;
   at least one second valve which is connected between the reservoir and the gas input of the flow controller such that the reservoir is in fluid communication with the flow controller when the second valve is open;

a second pressure source which is capable of maintaining the reservoir at approximately the sublimation pressure of the gas when the at least one second valve is closed; and third valve which is connected between the gas output of the flow controller and the etch chamber such that the flow controller is in fluid communication with the etch chamber when the at least one third valve is open.

2. The apparatus as claimed in claim 1, further comprising a mixer, connected between the gas output of the flow controller and the etch chamber, which is capable of mixing the gas with an inert carrier gas.

3. The apparatus as claimed in claim 1, further comprising:
- a carrier gas supply line which is capable of supplying a carrier gas; and
- at least one fourth valve which is connected between the carrier gas supply line and the gas output of the flow controller such that the carrier gas supply line is in fluid communication with the gas output of the flow controller when the fourth valve is open.

4. The apparatus as claimed in claim 1, further comprising a roughing pump connected to the etch chamber, the source chamber and the carrier gas supply line.

5. An apparatus for etching a workpiece comprising:
- an etch chamber;
- a source chamber which is capable of containing a gas;
- a first pressure source which is capable of providing a sublimation pressure of the gas within the source chamber;
- a reservoir;
- at least one first valve which is connected between the source chamber and the reservoir such that the source chamber is in fluid communication with the reservoir when the first valve is open;
- a pressure based flow controller, having a gas input and a gas output, which is capable of controlling a flow rate of the gas which flows there through from the gas input to the gas output;
- at least one second valve which is connected between the reservoir and the gas input of the flow controller such that the reservoir is in fluid communication with the pressure based flow controller when the second valve is open; and
- a second pressure source which is capable of maintaining the reservoir at approximately the sublimation pressure of the gas when the second valve is closed; and
- at least one third valve which is connected between the gas output of the pressure based flow controller and the etch chamber such that the pressure based flow controller is in fluid communication with the etch chamber when the third valve is open.

6. The apparatus as claimed in claim 5, further comprising a mixer, connected between the gas output of the pressure based flow controller and the etch chamber, which is capable of mixing the gas with an inert carrier gas.

7. The apparatus as claimed in claim 5, further comprising:
- a carrier gas supply line which is capable of supplying a carrier gas; and
- at least one fourth valve which is connected between the carrier gas supply line and the gas output of the flow controller such that the carrier gas supply line is in fluid communication with the gas output of the flow controller when the fourth valve is open.

8. The apparatus as claimed in claim 5, further comprising a roughing pump connected to the etch chamber, the source chamber and the carrier gas supply line.

* * * * *